United States Patent
Feng et al.

(10) Patent No.: US 7,313,750 B1
(45) Date of Patent: Dec. 25, 2007

(54) EFFICIENT SOFT DECISION DEMAPPER TO MINIMIZE VITERBI DECODER COMPLEXITY

(75) Inventors: Shuling Feng, San Jose, CA (US); Chien-Cheng Tung, Fremont, CA (US)

(73) Assignee: Ralink Technology, Inc., Cupertino, CA (US)

( * ) Notice: Subject to any disclaimer, the term of this patent is extended or adjusted under 35 U.S.C. 154(b) by 644 days.

(21) Appl. No.: 10/912,996

(22) Filed: Aug. 5, 2004

Related U.S. Application Data (60) Provisional application No. 60/493,380, filed on Aug. 6, 2003.

(51) Int. Cl.
*H03M 13/03* (2006.01)
*H03D 1/00* (2006.01)

(52) U.S. Cl. ............... 714/796; 375/341; 714/786; 714/795

(58) Field of Classification Search ............ 714/786, 714/795, 796; 375/341
See application file for complete search history.

(56) References Cited

U.S. PATENT DOCUMENTS

2002/0138806 A1* 9/2002 Scalise et al. ............ 714/786
2003/0185318 A1* 10/2003 Kolze ...................... 375/341
2004/0255230 A1* 12/2004 Chen et al. ................ 714/796

* cited by examiner

*Primary Examiner*—David C. Payne
*Assistant Examiner*—Aslan Ettehadieh
(74) *Attorney, Agent, or Firm*—Law Offices of Imam

(57) ABSTRACT

A receiver system that receives signals and has a demapper device that is responsive to an equalizer output and generates a demapper output including one or more bit metrics. The receiver system also generates equalizer output, and the demapper uses distance measure to calculate bit metrics. The receiver system uses demapper output to generate a processed output. The receiver system further includes a convolutional decoder which is responsive to the processed output, and subsequently generates a decoded bit sequence, as well as uses the processed output to generate one or more path metrics. The convolutional decoder uses bit metrics and path metrics to the decode processed output, to generate a decoded bit sequence. The receiver system uses the distance measure to reduce the size of the bit metrics and the size of the path metrics to improve the performance of said convolutional decoder.

18 Claims, 6 Drawing Sheets

OFDM receiver block diagram

*FIG. 1 OFDM receiver block diagram*

EFFICIENT SOFT DECISION DEMAPPER TO MINIMIZE VITERBI DECODER COMPLEXITY

REFERENCE TO PRIOR APPLICATION

This application claims the benefit of a previously filed U.S. Provisional Patent Application No. 60/493,380 filed on Aug. 6, 2003, and entitled "AN EFFICIENT SOFT DECISION DEMAPPER TO MINIMIZE VITERBI DECODER COMPLEXITY."

BACKGROUND OF THE INVENTION

1. Field of the Invention

The present invention relates generally to the field of wireless receivers and particularly to a method and apparatus for minimizing convolutional decoder complexity for decoding received signals under the effects of multi-path channel.

2. Description of the Prior Art

As computers have gained enormous popularity in recent decades, so have networking the same allowing for access of files by one computer from another. More recently and with the advent of wireless communication, remote and wireless networking of computers is gaining more and more notoriety among personal users, small and large business owners, factory facilities and the like.

With regard to the wireless networking of personal computers including laptops, a particular modem, namely modems adapted to the IEEE 802.11a or 802.11g industry standard, are commonly employed. That is, an antenna is placed inside or nearby the personal computer and an RF chip receives signal or data through the antenna and an analog-to-digital converter, typically located with in the personal computer (PC), converts the received signal to baseband range. Thereafter, a baseband processor is employed to process and decode the received signal to the point of extracting raw data, which may be files transferred remotely and wireless, from another PC or similar equipment with the use of a transmitter with in the transmitting PC.

There are several prior art apparatus and techniques for implementing 802.11a/g modem receivers, however, such prior art have not successfully utilized the fullest potential of the 802.11a/g modem. For example, the maximum rate of this type of modem device is 54 Mbits/sec. but in the presence of multi-path channel, use of current prior art methods and apparatus does not allow for reception of data at such rates. In fact, successful reception of data under multi-path channel conditions currently takes place at lower rates or may fail altogether.

Furthermore, in areas other than open locations, such as smaller office cubicles located with in the inter structure of a building, prior art receivers are known to only operate at rates lower than that of the maximum operational rate of the modem, such as 54 Mbits/sec., thus preventing a user from receiving files from another PC at optimal rates. This is generally due to the prior art techniques' limitations in operating with in multi-path channel conditions, which occur mostly in closed areas, such as those mentioned hereinabove. In particular, multi-path channel may degrade a receiver's ability to decode the received signals due to complexity of the decoding process used in a conventional decoder. For 802.11 a/g modems that modulate data using orthogonal frequency division multiplexing (OFDM), multi-path channel may lead to considerable loss in data detection performance because bit metric calculations used to calculate distance between the expected bit sequence and the received bit sequence are extensive and may require considerable hardware area. Thus, for high performance 802.11 a/g modems it is advantageous to find efficient methods for calculating bit metrics while reducing hardware complexity.

In light of the foregoing, it is desirable to develop an OFDM modem that can receive signals, such as those specified by the 802.11 a/g standards, accurately in the presence of multi-path channel and with the ability to receive maximum data rate throughputs. The presence of multi-path channel should be mitigated in such a way as to reduce the complexity of the decoding process used in a conventional decoder. Further, it is essential that enhancing the performance of the OFDM receiver be accomplished with out adding considerable complexity to the hardware resources employed in processing the received OFDM signal.

SUMMARY OF THE INVENTION

Briefly, an embodiment of the present invention includes a receiver system for receiving signals having a demapper device being responsive to an equalizer output for processing the same to generate a demapper output, said demapper output for including one or more bit metrics, said receiver system being responsive to a received signal for processing the same to generate said equalizer output, said demapper device for using a distance measure to calculate said bit metrics, said receiver system for using said demapper output to generate a processed output. The receiver system further includes a convolutional decoder being responsive to said processed output for processing the same to generate a decoded bit sequence, said convolutional decoder for using said processed output to generate one or more path metrics, said convolutional decoder for using said bit metrics and said path metrics to decode said processed output to generate said decoded bit sequence, said receiver system for using said distance measure to reduce the size of said bit metrics and the size of said path metrics to improve the performance of said convolutional decoder.

The foregoing and other objects, features and advantages of the present invention will be apparent from the following detailed description of the preferred embodiments which make reference to several figures of the drawing.

DETAILED DESCRIPTION OF THE PREFERRED EMBODIMENTS

Figure 1:
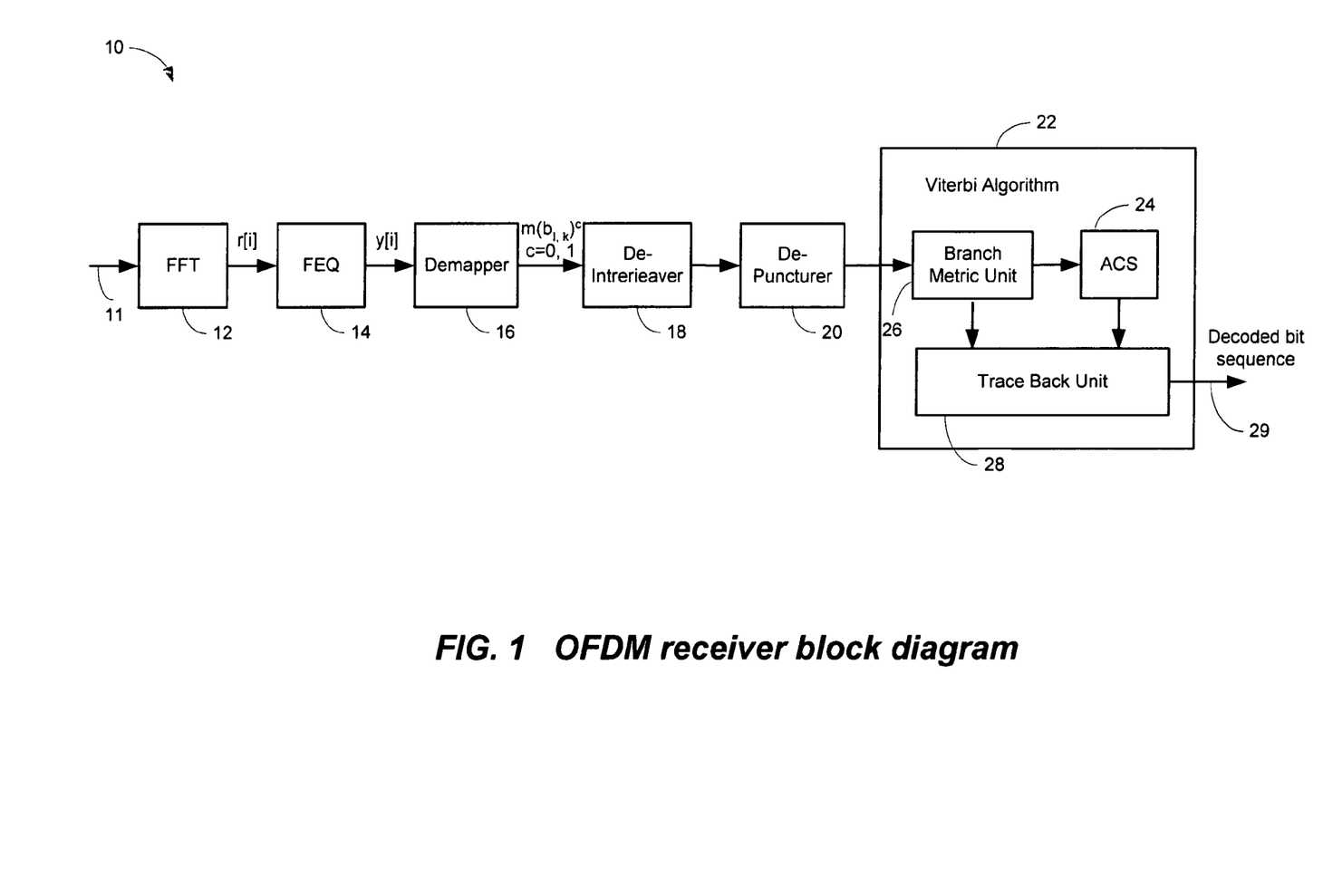
FIG. 1 shows a block diagram of a portion of an orthogonal frequency division multiplexing (OFDM) baseband receiver system, according to an embodiment of the present invention.

Referring now to FIG. 1, a block diagram of a portion of an orthogonal frequency division multiplexing (OFDM) baseband receiver system 10 is shown to include a Fast Frequency Transformation (FFT) device 12, a frequency domain equalizer (FEQ) 14, a demapper device 16, a de-interleaver device 18, a de-puncturer device 20, and a Viterbi decoder 22, in accordance with an embodiment of the present invention. The input to the OFDM baseband receiver system 10 comprises received signal 11 transmitted originally by a transmitter. The received signal 11 is often received through wireless transmission of a transmitted signal that has been encoded. As such, the received signal 11 needs to be decoded to retrieve the transmitted signal.

In FIG. 1 the received signal 11 is received by the FFT device 12, which is coupled to the FEQ 14. The FEQ 14 is coupled to the demapper device 16, which is in turn coupled to the de-interleaver device 18. The de-interleaver device 18 is coupled to the de-puncturer device 20, which is coupled to the Viterbi decoder 22.

In an alternative embodiment of the present invention any convolutional decoder may be used in the OFDM baseband receiver system 10 for decoding the received signal. An example of a convolutional decoder is the Viterbi decoder 22. The Viterbi decoder 22 includes a branch metric unit 26, an add/compare/select (ACS) unit 24, and a trace back unit 28. The branch metric unit 26 is coupled to both the ACS unit 24 and the trace back unit 28. The ACS unit 24 is also coupled to the trace back unit 28. The types of received signal 11 decoded by the Viterbi decoder 22 include bit interleaved coded modulation (BICM) OFDM-modulated packets often employed in 802.11 a/g OFDM modem receivers. Further, the Viterbi decoder 22 is needed for achieving good performance in multi-path channels using estimated channel information, as described in detail hereinbelow.

The received signal 11 includes a vector signal of 64 sample values, which are transferred to the FFT device 12. In one embodiment of the present invention, the FFT device 12 performs a 64-point FFT converting the 64 time domain signals of the received signal 11 into 64 frequency domain subcarriers, which comprise one transformed received signal. As specified by the IEEE 802.11 a/g Standard each symbol has 64 subcarriers of which 12 are reserved for guard band separation and 52 are dedicated to the transmitted signal.

The received signal 11 is modulated by the transmitter (not shown in FIG. 1) using multiple modulation schemes such as bipolar phase shift keying (BPSK), quadrature phase shift keying (QPSK), 16 quadrature amplitude modulation (QAM), and 64 QAM. Constellations for each of the aforementioned modulation schemes are presented in an IEEE Standard 802.11 a-1999 publication entitled "Part II: Wireless LAN Medium Access Control (MAC) and Physical Layer (PHY) Specs: High-Speed Physical Layer in the 5 GHz Band", pp. 20-21.

For example, when using 16 QAM, an input bit of '00' represents '-3' as the real component (I) and '10' represents '3' as the imaginary component (Q) located in the constellation point (-3,3) of the 16 QAM constellation. However, when transmitted, such a bit sequence may be distorted due to multi-path channel effects so that the received bit sequence may not be exactly at the (-3,3) point. In the present invention, an appropriate distance between the expected bit sequence, represented by the constellation point, and the received bit sequence is measured. The measured distance is weighted using information generated by the FEQ 14, as described hereinbelow in detail.

Specifically, the constellation order is represented by $2^{2m}$, m=1, 2, 3, bits for QPSK, 16 QAM, and 64 QAM, respectively. A total of m interleaved bits are mapped into I and Q components of the complex symbol generated by the FFT device 12, according to Gray-coded constellation mappings. Let $a[i]=a_I[i]+j\,a_Q[i]$ denote the QAM symbol transmitted in the $i^{th}$ subcarrier and $b_{I,0}$, $b_{I,1}$, . . . , $b_{I,(m-1)}$, $b_{Q,0}$, $b_{Q,1}$, . . . , $b_{Q,(m-1)}$ be the corresponding bit sequence. For each transmitted symbol a[i], the received symbol is processed by the FFT device 12 to generate the frequency domain representation thereof, r[i], according to $$r[i]=H[i]\cdot a[i]+n[i] \qquad \text{Eq. (1)}$$

where H[i] is the channel frequency response for the $i^{th}$ OFDM subcarrier and n[i] is a complex Gaussian noise with variance $\sigma^2[i]$.

The FEQ 14 processes the FFT output r[i] to generate an equalized output y[i] for the $i^{th}$ subcarrier. To correct the effects of multi-path channel the FEQ 14 applies a complex scaling factor to compensate for the channel response for each of the received subcarriers. The FEQ 14 is trained during the preamble portion of the received signal, as discussed in detail in Provisional Patent Application with Ser. No. 60/455,157 entitled "EFFICIENT SUBCARRIER WEIGHTING TO ENHANCE RECEIVER PERFORMANCE", filed on Mar. 14, 2003, the inventors thereof are Alain Chiodini and Thomas Pare, and the disclosure of which is herein incorporated by reference in its entirety.

The scaling factor is the channel frequency response H[i] determined by the FEQ 14. Assuming perfect estimation of channel frequency response, the equalizer output y[i] as determined by the FEQ 14 is given by $$y[i]=r[i]/H[i]=a[i]+n[i]/H[i]=a[i]+n'[i] \qquad \text{Eq. (2)}$$

where n'[i] is a complex Gaussian noise with variance $\sigma^2[i]/|H[i]|^2$.

In the embodiment of the present invention shown in FIG. 1, the decoder 22 is a soft decision Viterbi decoder. Accordingly, the demapper device 16 implements soft decision demapping to calculate bit metrics that are used for path metric calculations by the Viterbi decoder 22. In conventional methods of implementing soft decision demapping sub-optimal bit metrics in terms of Euclidean distances are used as discussed in E. Zehavi, "8-PSK Trellis Coded for a Rayleigh Channel", IEEE Trans. On Comm., vol. 40, pp. 873-884, May 1992. To avoid square terms in the Euclidean distance computations and to simplify bit metric representations, sub-optimal soft bit metrics may also be calculated as simplified Log-Likelihood Ratio (LLR), as discussed in F. Tosato and P. Bisaglia, "Simplified Soft Output Demapper for Binary Interleaved COFDM with Application on HIP-ERLAN/2", Internet publication, October 2001.

In the present invention, Euclidean bit metric is simplified and approximated using distance measures such as Manhattan distance to achieve a simpler and less expensive soft decision demapper implementation. In addition, saturation limits are applied on both the Euclidean distance and Manhattan distance to reduce bit metric and path metric size.

Specifically, for each of the 2m bit positions represented by a constellation point mentioned hereinabove, two metrics are derived for each of the possible bit values 0 and 1. For in-phase bit $b_{I,k}$ the QAM constellation is partitioned into 2 sets of in-phase symbols $S_{I,k}^{(0)}$ and $S_{I,k}^{(1)}$. The set $S_{I,k}^{(0)}$ comprises the symbols with a 0 and the set $S_{I,k}^{(1)}$ comprises the symbols with a 1 in the bit position (I,k). Similar remarks apply to the quadrature bit $b_{Q,k}$. As explained in E. Zehavi, the 2 metrics are derived for each k as $$m(b_{I,k})^c = \max \log p\left(r[i] \mid a[i] = \alpha\right), c = 0, 1 \quad \text{Eq. (3)}$$
$$\alpha \in S_{I,k}^c$$

where p is a complex Gaussian probability distribution function given by $$p(r[i] \mid a[i] = \alpha) = \frac{1}{\sqrt{2\pi}\sigma} e^{\frac{-|r[i] - H[i]\alpha|^2}{2\sigma^2}} \quad \text{Eq. (4)}$$

Combining Eq. (2)-Eq. (4), the 2 metrics may be written as $$m(b_{I,k})^c = |H(i)|^2 \cdot \min_{\alpha \in S_{I,k}^{(c)}} |y[i] - \alpha|^2, c = 0, 1 \quad \text{Eq. (5)}$$

Eq. (5) represents the bit metrics generated by the demapper device 16 wherein the minimum Euclidean distance between the equalizer output y[i] and the constellation points in $S_{I,k}^{(0)}$ and $S_{I,k}^{(1)}$ is weighted by the magnitude square of the channel frequency response, $|H[i]|^2$.

The expression to be minimized in Eq. (5) may be expanded to rewrite the bit metrics as $$m(b_{I,k})^c = |H(i)|^2 \cdot \min_{\alpha \in S_{I,k}^{(c)}} |y[i] - \alpha_I|^2 + |y_Q[i] - \alpha_Q|^2, \quad \text{Eq. (6)}$$
$$c = 0, 1$$

Hence, the difference between the metrics $m(b_{I,k})^0$ and $m(b^{I,k})^1$ becomes $$m(b_{I,k})^0 - m(b_{I,k})^1 = |H(i)|^2 \left\{ \min_{\alpha \in S_{I,k}^{(0)}} (|y_I[i] - \alpha_I|^2 + |y_Q[i] - \alpha_Q|^2) - \right. \quad \text{Eq. (7)}$$

$$\left. \min_{\alpha \in S_{I,k}^{(1)}} (|y_I[i] - \alpha_I|^2 + |y_Q[i] - \alpha_Q|^2) \right\}$$

Figure 2A:
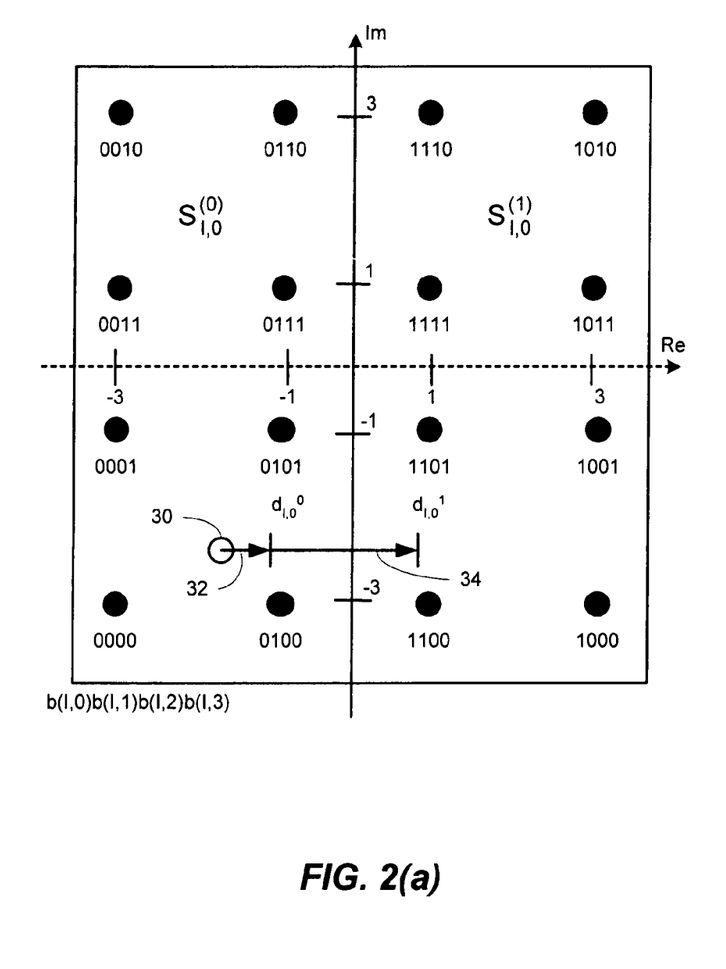
FIG. 2(a) shows the in-phase component of the first bit of a 16 quadrature amplitude modulation (QAM) scheme, according to an embodiment of the present invention.
Figure 2B:
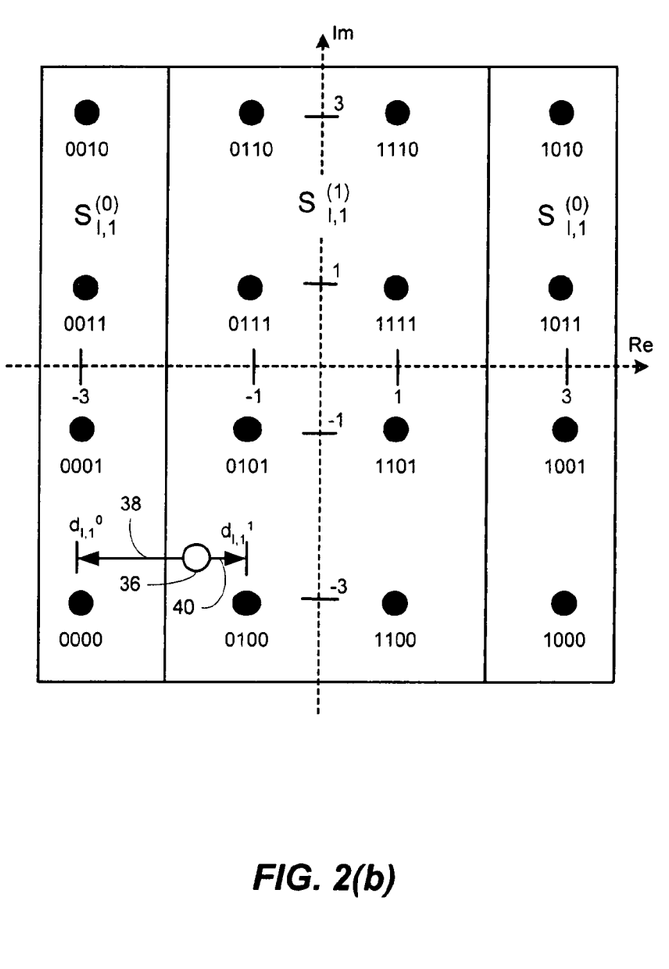
FIG. 2(b) shows the in-phase component of the second bit of a 16 QAM scheme, according to an embodiment of the present invention.
Figure 2C:
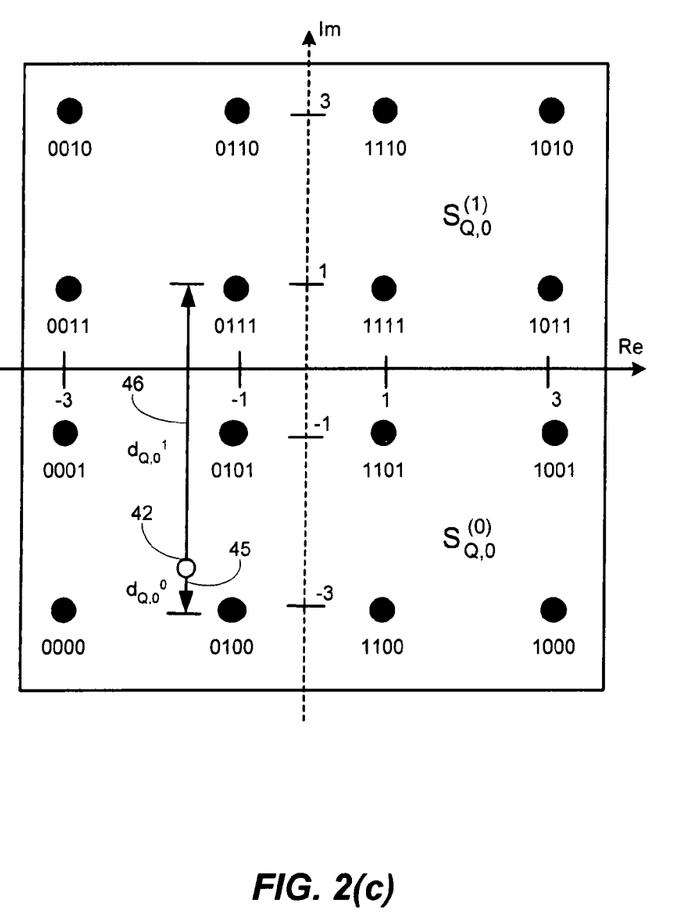
FIG. 2(c) shows the quadrature component of the first bit of a 16 QAM scheme, according to an embodiment of the present invention.
Figure 2D:
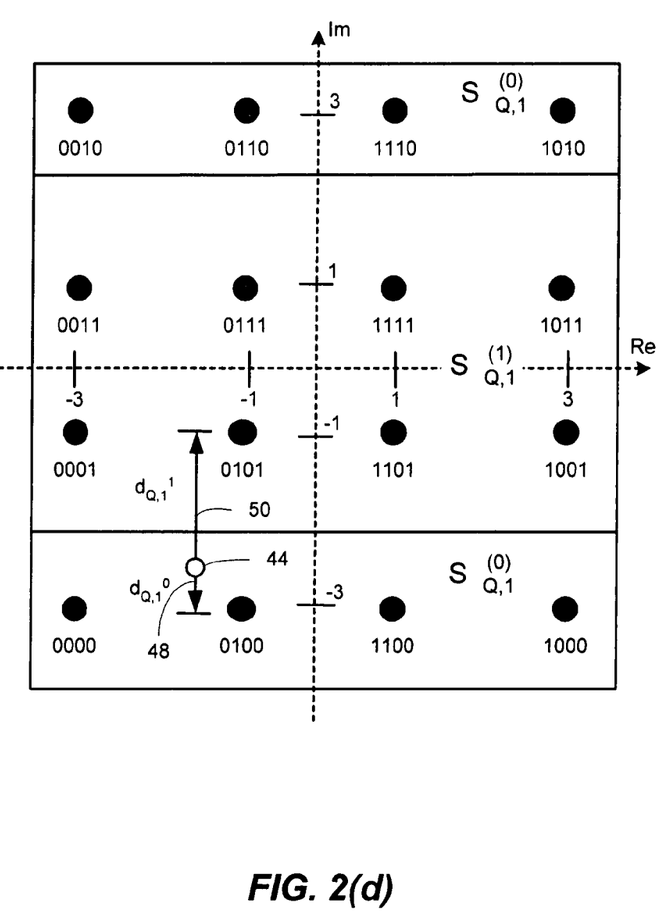
FIG. 2(d) shows the quadrature component of the second bit of a 16 QAM scheme, according to an embodiment of the present invention.

To simplify the difference between the 2 metrics reference is made to FIGS. 2(a)-2(d) wherein constellation partitions for 16 QAM are shown, in accordance with an embodiment of the present invention. FIGS. 2(a) and 2(b) indicate ideal constellation points for the first and second bits of a 16 QAM scheme, respectively, corresponding to the in-phase component of the equalizer output; whereas FIGS. 2(c) and 2(d) indicate the corresponding constellation points for the quadrature component of the equalizer output.

It is noted that bit metrics are represented in pairs, i.e., for a bit position $b_{I,k}$ there are two bit metrics $m(b_{I,k})^0$ and $m(b_{I,k})^1$.

Referring back to FIG. 2(a), the in-phase component of the equalizer output 30, represented by a circle, is shown in a 16 QAM constellation format. The sets $S_{I,0}^{(0)}$ and $S_{I,0}^{(1)}$ in FIG. 2(a) are partitioned as $a[i] \in S_{I,0}^{(0)}$, if $a_1[i] < 0$ $a[i] \in S_{I,0}^{(1)}$, if $a_1[i] \geq 0$ The sets $S_{I,1}^{(0)}$ and $S_{I,1}^{(1)}$ in FIG. 2(b) are partitioned as $a[i] \in S_{I,1}^{(0)}$, if $a_1[i] < -2$ or $a_1[i] \geq 2$ $a[i] \in S_{I,1}^{(1)}$, if $-2 \leq a_1[i] < 2$ The nearest constellation point (−1,−3) of the set $S_{I,0}^{(0)}$ to the equalizer output 30 always lies in the same row as the nearest constellation point (1,−3) of the set $S_{I,0}^{(1)}$ to the equalizer output 30.

Similarly, in Eq. 2(b), the nearest constellation point (−3,3) of the set $S_{I,0}^{(1)}$ to the equalizer output 36 always lies in the same row as the nearest constellation point (−1,−3) of the set $S_{I,1}^{(1)}$ to the equalizer output 36. Accordingly, the quadrature components in Eq. (7) are cancelled so that only the Euclidean distances along the real axis (the horizontal axis in FIGS. 2(a) and 2(b)) contribute to the difference in the bit metrics. Specifically, the bit metric difference is simplified as $$m(b_{I,k})^0 - m(b_{I,k})^1 = \quad \text{Eq. (8)}$$
$$|H(i)|^2 \left\{ \min_{\alpha \in S_{I,k}^{(0)}} |y_I[i] - \alpha_I|^2 - \min_{\alpha \in S_{I,k}^{(1)}} (|y_I[i] - \alpha_I|^2) \right\}$$

It is shown hereinbelow that selecting $m(b_{I,k})^0$ and $m(b_{I,k})^1$ as a first set of bit metrics to calculate the path metrics in a Viterbi decoder is equivalent to selecting $$|H(i)|^2 \min_{\alpha \in S_{I,k}^{(0)}} |y_I[i] - \alpha_I|^2,$$

$$|H(i)|^2 \min_{\alpha \in S_{I,k}^{(1)}} |y_I[i] - \alpha_I|^2$$

as a second set of bit metrics because Eq. (8) indicates that the difference between the first set of bit metrics is the same as the difference between the second set of bit metrics. Thus, the bit metrics in Eq. (6), wherein a 2-dimensional Euclidean distance has been utilized, may be simplified as $$m(b_{I,k})^c = |H(i)|^2 \cdot \min_{\alpha \in S_{I,k}^{(c)}} |y_i[i] - \alpha_I|^2 = |H(i)|^2 \cdot (d_{I,k}^c)^2, \quad \text{Eq. (9)}$$

$$c = 0, 1 \text{ where } d_{I,k}^c = \cdot \min_{\alpha \in S_{I,k}^{(c)}} |y_i[i] - \alpha_I|, c = 0, 1.$$

Eq. (9) represents a demapping rule for determining $m(b^{I,k})^c$ wherein a 1-dimensional Euclidean distance measure, i.e. $(d_{I,k}^c)^2$, is utilized.

The same demapping rule applies to the bit metrics $m(b_{Q,k})^c$. Namely, referring to FIGS. 2(c) and 2(d), the nearest constellation points of the sets of quadrature symbols $S_{Q,k}^{(0)}$, k=0,1, to the equalizer outputs 42 and 44 lie in the same columns as the nearest constellation points of the sets of quadrature symbols $S_{Q,k}^{(1)}$, k=0,1, to the equalizer outputs 42 and 44. Accordingly, the difference between $m(b_{Q,k})^0$ and $m(b_{Q,k})^1$ may be simplified and the bit metrics written as $$m(b_{Q,k})^c = |H(i)|^2 \cdot \min_{\alpha \in S_{Q,k}^{(c)}} |y_Q[i] - \alpha_Q|^2 = |H(i)|^2 \cdot (d_{Q,k}^c)^2, c = 0, 1 \quad \text{Eq. (10)}$$

$$\text{where } d_{Q,k}^c = \min_{\alpha \in S_{Q,k}^{(c)}} |y_Q[i] - \alpha_Q|, c = 0, 1.$$

Further simplification in bit metric calculations may be achieved by approximating the simplified Euclidean distances $(d_{I,k}^c)^2$ and $(d_{Q,k}^c)^2$ in Eqs. (9) and (10) with a distance measure referred to hereinbelow as 1-dimensional Manhattan distance or simplified Manhattan distance having an in-phase part $d_{I,k}^c$ and a quadrature part $d_{Q,k}^c$ given by $$m(b_{I,k})^c = |H(i)|^2 \cdot \min_{\alpha \in S_{I,k}^{(c)}} |y_I[i] - \alpha_I| = |H(i)|^2 \cdot d_{I,k}^c, c = 0, 1 \quad \text{Eq. (11)}$$

$$m(b_{Q,k})^c = |H(i)|^2 \cdot \min_{\alpha \in S_{Q,k}^{(c)}} |y_Q[i] - \alpha_Q| = |H(i)|^2 \cdot d_{Q,k}^c, c = 0, 1. \quad \text{Eq. (12)}$$

Use of the simplified Manhattan distance, in equations (11) and (12), results in substantial reduction in bit metric and path metric size and reduces the power consumption of the Viterbi decoder 22. Equations (11) and (12) embody demapping rules for calculation of the bit metrics implemented by the demapper device 16 for modulation schemes of various orders.

In FIGS. 2(a)-2(d), curves 32, 34, 38, 40, 45-50 represent simplified Manhattan distances $d_{I,k}^c$ and $d_{Q,k}^c$, c=0,1 and k=0,1.

Based on Eqs. (11) and (12) simplified Manhattan distance calculations for the 16 QAM scheme are found to be $$d_{I,0}^0 = \begin{cases} |y_I[i] + 3|, & -4 > y_I[i] < -2 \\ |y_I[i] + 1|, & -2 \leq y_i[i] < 4 \end{cases} \quad \text{Eq. (13)}$$

$$d_{I,0}^1 = \begin{cases} |y_I[i] - 1|, & -4 > y_I[i] < 2 \\ |y_I[i] - 3|, & -2 \leq y_i[i] < 4 \end{cases} \quad \text{Eq. (14)}$$

$$d_{I,1}^0 = |3 - |y_I[i]||, -4 < y_I[i] < 4 \quad \text{Eq. (15)}$$

$$d_{I,1}^1 = |1 - |y_I[i]||, -4 < y_I[i] < 4 \quad \text{Eq. (16)}$$

Figure 3A:
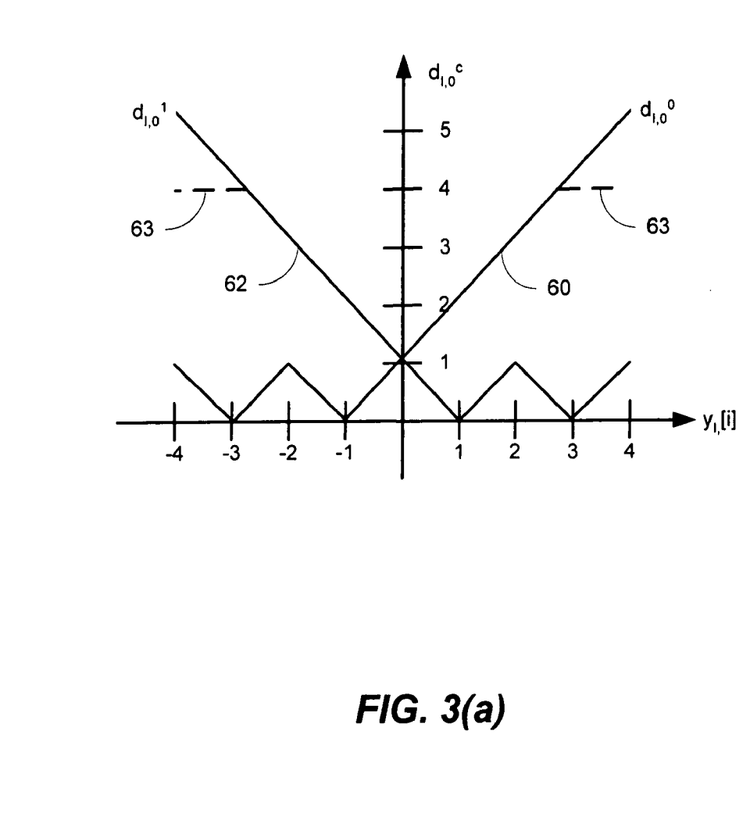
FIG. 3(a) shows the graph of Manhattan distance for the first bit of a 16 QAM scheme, according to an embodiment of the present invention.

Referring now to FIG. 3(a), the graph of simplified Manhattan distances for the first bit of a 16 QAM scheme is shown, in accordance with an embodiment of the present invention. On the horizontal axis the in-phase component of the equalizer output $y_I[i]$ is plotted. Curve 60 indicates the graph of $d_{I,0}^0$ given by Eq. (13) and curve 62 indicates the graph of $d_{I,0}^1$ given by Eq. (14). The curve 60 has zeroes at $y_I[i]=-1,-3$ and the curve 62 has zeroes at $y_I[i]=1, 3$. The dashed line 63 at $d_{I,0}^c=4$ indicates a saturation limit described in more detail hereinbelow.

Figure 3B:
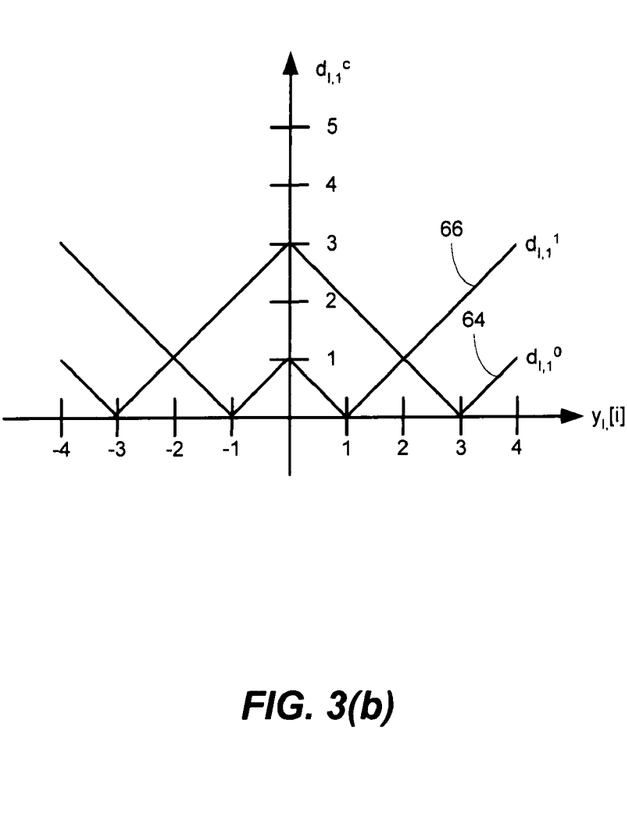
FIG. 3(b) shows the graph of Manhattan distance for the second bit of a 16 QAM scheme, according to an embodiment of the present invention.

Referring now to FIG. 3(b), the graph of simplified Manhattan distances for the second bit of a 16 QAM scheme is shown, in accordance with an embodiment of the present invention. Curve 64 indicates the graph of $d_{I,1}^c$, c=0, given by Eq. (15) having zeroes at $y_I[i]=-3, 3$. Curve 66 indicates the graph of $d_{I,1}^c$, c=1, given by Eq. (16) having zeroes at $y_I[i]=-1, 1$.

Similarly, for a 64 QAM scheme there are 3 sets of bit metrics for in-phase bits and 3 sets of bit metrics for quadrature bits. Corresponding to the in-phase bits there are 6 simplified Manhattan distances given by $$d_{I,0}^0 = \begin{cases} |y_I[i] + 7|, & -8 < y_I[i] < -6 \\ |y_I[i] + 5|, & -6 \leq y_I[i] < -4 \\ |y_I[i] + 3|, & -4 \leq y_I[i] < -2 \\ |y_I[i] + 1|, & -2 \leq y_I[i] < 8 \end{cases} \quad \text{Eq. (17)}$$

$$d_{I,0}^1 = \begin{cases} |y_I[i] - 1|, & -8 < y_I[i] < 2 \\ |y_I[i] - 3|, & 2 \leq y_I[i] < 4 \\ |y_I[i] - 5|, & 4 \leq y_I[i] < 6 \\ |y_I[i] - 7|, & 6 \leq y_I[i] < 8 \end{cases} \quad \text{Eq. (18)}$$

$$d_{I,1}^0 = \begin{cases} |7 - |y_I[i]||, & 6 \leq y_I[i] < 8 \\ |5 - |y_I[i]||, & |y_I[i]| < 6 \end{cases} \quad \text{Eq. (19)}$$

$$d_{I,1}^1 = \begin{cases} |3 - |y_I[i]||, & 2 \leq y_I[i] < 8 \\ |1 - |y_I[i]||, & |y_I[i]| < 2 \end{cases} \quad \text{Eq. (20)}$$

$$d_{I,2}^0 = \begin{cases} |7 - |y_I[i]||, & 4 \leq y_I[i] < 8 \\ |1 - |y_I[i]||, & |y_I[i]| < 4 \end{cases} \quad \text{Eq. (21)}$$

$$d_{I,2}^1 = \begin{cases} |5 - |y_I[i]||, & 4 \leq y_I[i] < 8 \\ |3 - |y_I[i]||, & |y_I[i]| < 4 \end{cases} \quad \text{Eq. (22)}$$

Figure 4A:
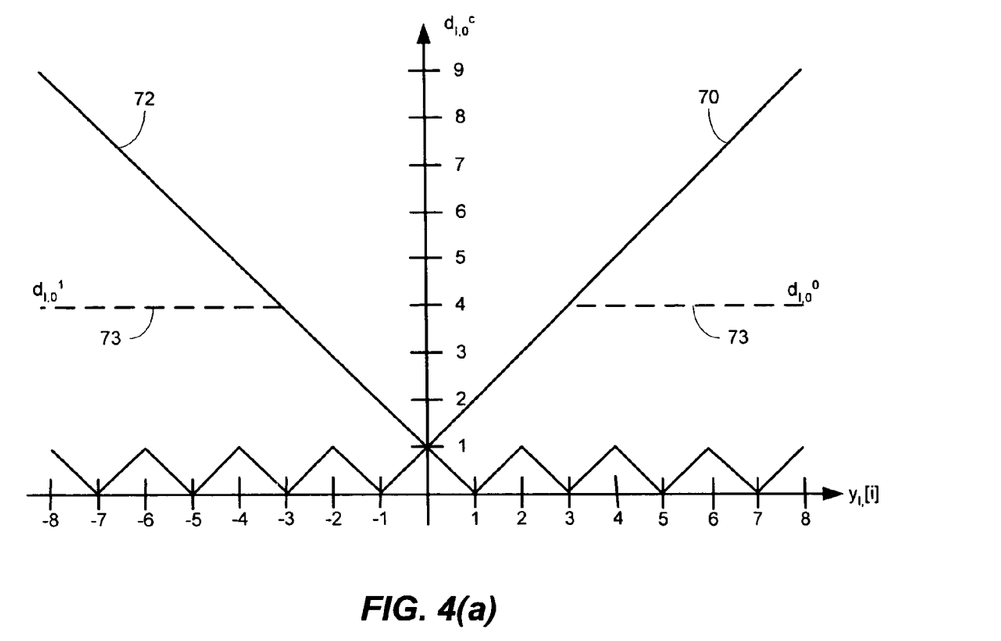
FIG. 4(a) shows the graph of Manhattan distance for the first bit of a 64 QAM scheme, according to an embodiment of the present invention.

Referring now to FIG. 4(a), the graphs of $d_{I,0}^0$ and $d_{I,0}^1$ given by Eqs. (17) and (18) are plotted as curves 70 and 72, respectively, vs. the in-phase component of the equalizer output $y_I[i]$. The curves 70 and 72 indicate simplified Manhattan distances for the first bit of a 64 QAM scheme. The dashed line 73 at $d_{I,0}^c=4$ indicates the saturation limit. Curve 70 has zeroes at $y_I[i]=-7, -5, -3, -1$ and curve 72 has zeroes at $y_I[i]=1, 3, 5, 7$.

Figure 4B:
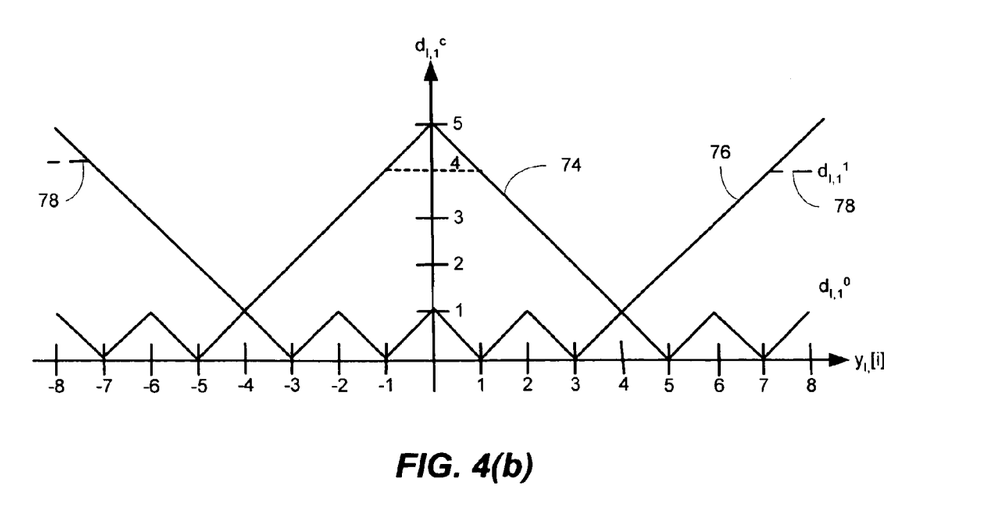
FIG. 4(b) shows the graph of Manhattan distance for the second bit of a 64 QAM scheme, according to an embodiment of the present invention.

Referring now to FIG. 4(b), the graph of simplified Manhattan distances for the second bit of a 64 QAM scheme is shown, in accordance with an embodiment of the present invention. The curve 74 indicates the graph of $d_{I,1}^c=0$, obtained from Eq. (19) while the curve 76 indicates the graph of $d_{I,1}{}^c=1$, obtained from Eq. (20). The curve 74 has zeroes at $y_I[i]=-7, -5, 5, 7$ while the curve 76 has zeroes at $y_I[i]=-3, -1, 1, 3$. Saturation limit at $d_{I,0}{}^c=4$ is indicated in FIG. 4(*b*) by the dashed line 78.

Figure 4C:
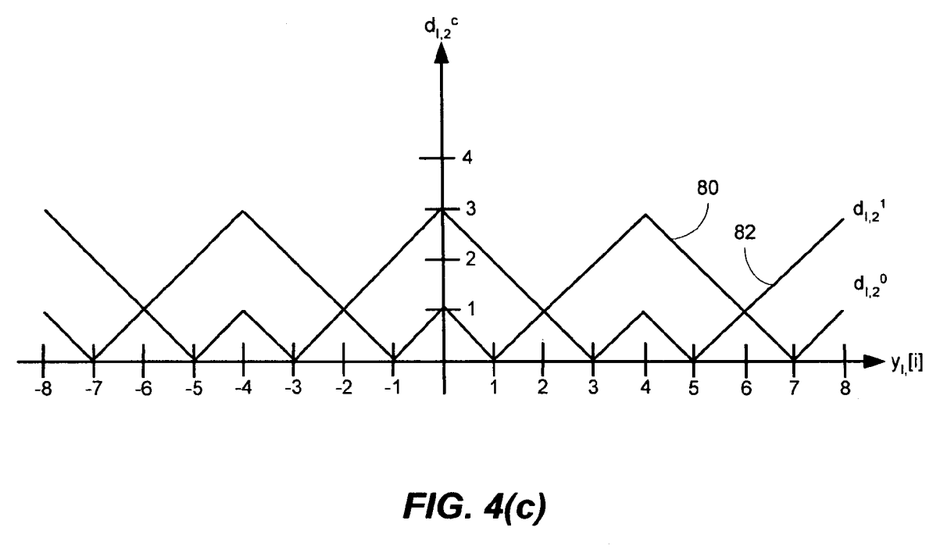
FIG. 4(c) shows the graph of Manhattan distance for the third bit of a 64 QAM scheme, according to an embodiment of the present invention.

Referring now to FIG. 4(*c*), the graph of simplified Manhattan distances for the third bit of a 64 QAM scheme is shown to include two curves 80 and 82, in accordance with an embodiment of the present invention. The curve 80 is the graph of $d_{I,k}{}^c=0$ and k=2, obtained by plotting Eq. (21) vs. $y_I[i]$ and the curve 82 is obtained by plotting Eq. (22) vs. $y_I[i]$. The curve 80 has zeroes at $y_I[i]=-7, -1, 1, 7$ while the curve 82 has zeroes at $y_I[i]=-5, -3, 3, 5$.

Eqs. (11) and (12) may also be used to derive demapping rules for BPSK and QPSK modulation schemes having 1 and 2 embedded bits per constellation point, respectively. Accordingly, simplified Manhattan distances for BPSK and QPSK are given by $$d_{I,0}{}^0=|y_I[i]+1|   \text{Eq. (23)}$$

$$d_{I,0}{}^1=|y_I[i]-1|   \text{Eq. (24)}$$

Figure 5:
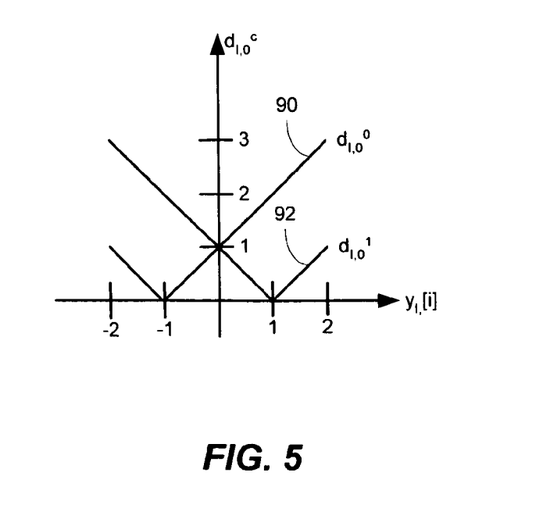
FIG. 5 shows the graph of Manhattan distance for bipolar phase shift keying (BPSK) and quadrature phase shift keying (QPSK) modulation schemes, according to an embodiment of the present invention.

Referring now to FIG. 5, the graphs of $d_{I,0}{}^0$ and $d_{I,0}{}^1$, according to Eqs. (23) and (24), are plotted vs. $y_I[i]$, in accordance with an embodiment of the present invention. The curves 90 and 92 in FIG. 5 are graphs $d_{I,0}{}^0$ and $d_{I,0}{}^1$ obtained by plotting Eqs. (23) and (24), respectively. The curve 90 has a zero at $y_I[i]=-1$ while the curve 92 has a zero at $y_I[i]=1$.

In the 16 QAM scheme mentioned hereinabove $0 \leq d_{I,0}{}^c<5$, and $0<d, <3$. In general if N bits are required to represent $d_{I,1}{}^c$ in hardware with adequate resolution, N+1 bits would be required for $d_{I,0}{}^c$. Thus, the larger number of bits, i.e. N+1 bits, will have to be used for bit metrics for 16 QAM scheme. To avoid the 1-bit growth in the bit metric size, $d_{I,0}{}^c$ is using the saturation limit of 4 as shown by the dashed line 63 in FIG. 3(*a*). Saturation limits are also applied to $d_{Q,0}{}^c$, i.e., $d_{Q,0}{}^c<4$.

Similarly, for the 64 QAM scheme saturation limits are applied to $d_{I,0}{}^c$, $d_{Q,0}{}^c$, $d_{I,1}{}^c$, and $d_{Q,1}{}^c$, as shown in FIGS. 4(*a*) and 4(*b*) by the dashed lines 73 and 78, respectively.

The bit metrics represent distances between the expected bit and the received bit while the path metrics are accumulation of distances. The Viterbi decoder 22 selects the minimum path metric to decode the received signal. As a result, saturation limits on bit metrics have negligible impact on the decoding performance of the Viterbi decoder 22. Indeed, simulation results have shown that applying the saturation limits $d_{I,k}{}^c<4$ and $d_{Q,k}{}^c<4$ reduces the bit metric size by ⅓ for various modulation schemes and data rates.

In Eqs. (11) and (12) bit metrics are calculated by weighting estimated magnitude square channel frequency response $|H[i]|^2$ on Manhattan distances. In general, the smaller the bit metric, the more likely the received bit is decided as 0 or 1 while the larger the bit metric the less likely the decision becomes. The bit metric value $2^{N-1}$ indicating the value of the received bit is undecided between 0 and 1. Weighting $|H[i]|^2$ on distances may be simplified with binary right shifting towards the middle value $2^{N-1}$ as the value of $|H[i]|^2$ decreases, as described in more detail in the patent application mentioned hereinabove.

Referring back to FIG. 1, the output of the demapper device 16 includes bit metrics $m(b_{I,k})^0$ and $m(b_{I,k})^1$. Interleaving of the transmitted signal performed generally by the transmitter permutes bit sequences. The de-interleaver device 18 performs the reverse of interleaving by randomizing burst errors to generate a de-interleaved output.

The de-puncturer device 20 processes the de-interleaved output to generate a processed output. A puncturing device usually located with in the transmitter removes some of the redundant bits to avoid substantial reduction in the transmission rate. The de-puncturer device 20 re-inserts the removed bits to generate the processed output.

The branch metric unit 26 of the Viterbi decoder 22 receives the processed output. For the rate 1/2 Viterbi decoder there are two bit metrics $m0^c$ and $m1^c$, c=0,1, for every 2 bits, i.e., a di-bit $b_0 b_1$ in the processed output. The branch metric unit 26 calculates the branch metrics (BM) globally as the sum of two bit metrics to generate the 4 possible values $$BM[0]=m0^0+m1^0$$

$$BM[1]=m0^0+m1^1$$

$$BM[2]=m0^1+m1^0$$

$$BM[3]=m0^1+m1^1$$

The branch metrics BM[0]-BM[4] are assigned to 4 nodes or states at the initial time step of a trellis. From each node on the trellis two paths lead to two possible nodes at the subsequent time step of the trellis following a butterfly format known to those skilled in the art. Thus, for a rate 1/2 Viterbi decoder having 64 states 32 butterflies are required. Each path has associated therewith a branch metric determined by the branch metric unit 26. Each node on the trellis has a path metric associated therewith. The path metrics are updated by adding the branch metric of the path to the path metric of the initial node to determine the path metric of the succeeding node that is connected to the initial node by the same path.

The updated path metrics are stored in a memory location in the ACS unit 24. Further, the updated path metrics are compared and a minimum path metric is selected as the new path metric for each node by the ACS unit 24. Also stored in the memory location of the ACS unit 24 is the path, designated as the minimum path corresponding to the minimum path metric. The minimum path is traced back by the trace back unit 28 to determine the decoded bit sequence as the output of the Viterbi decoder 22.

In the present invention saturation on the path metric is allowed since the minimum path is selected among all the decoding states for trace back. The path with a path metric saturation is highly unlikely to be selected as the path to be traced back. Simulations have shown that an N+3 bit path metric is adequate for most data rates.

In addition, simulations have shown that the Viterbi decoder 22 performs similarly whether using the simplified Manhattan distance or the simplified Euclidean distance under both additive white Gaussian noise (AWGN) and multi-path channel conditions. As simplified Manhattan distances $d_{I,k}{}^c$ and $d_{Q,k}{}^c$ are saturated to a value of 4, as shown in FIGS. 3(*a*), 4(*a*), and 4(*b*), Euclidean distances $(d^{I,k,c})^2$ and $(d_{Q,k}{}^c)^2$ are saturated to a value of 16.

The Viterbi decoder 22 using the simplified Manhattan distance or the simplified Euclidean distance with the aforementioned saturation limits saves more that ⅓ on the path metric size compared to a decoder employing conventional algorithms such as the LLR scheme. The savings is in both hardware complexity and area size. In addition, power consumption by the Viterbi decoder 22 using the simplified Manhattan distance or the simplified Euclidean distance is reduced considerably compared to conventional decoders. One reason for such reduction is the implementation of the minimum function in the bit metrics given by Eqs. (11) and (12) allowing saturation limits to be imposed on the bit metric values. In contrast, the LLR scheme employs a maximum function thereby precluding the use of saturation values mentioned hereinabove.

Returning to the assertion made hereinabove, it is shown that 2 sets of bit metrics having the same difference are equivalent in decoding bit sequences. To this end, a method of calculating the path metrics by a Viterbi decoder using bit metrics $m^0$ and $m^1$ is denoted as method A and another method of calculating the path metrics by a Viterbi decoder using bit metrics $m^{0'}$ and $m^{1'}$ is denoted as method B. In what follows, it is shown that the decoded bit sequences $\hat{b}$ and $\hat{b}'$ obtained by methods A and B, respectively, are the same provided the two sets of bit metrics have the same difference, i.e., $m^{0'}-m^0=m^{1'}-m^1=\delta$.

Since $\hat{b}$ is the bit sequence decoded by method A, then its path metric is the smallest, i.e., $PM^A(\hat{b})=PM_{min}^A$. Also, $PM^B(\hat{b}')=PM_{min}^B$, and $$PM^B(\hat{b}') \leq PM^B(\hat{b}) \qquad \text{Eq. (25)}$$

The difference between path metrics in method B and method A can be written as, $$PM^B(\hat{b}') - PM^A(\hat{b}') = \sum_{b_k \in \hat{b}'} m^{c'}(b_k) - \sum_{b_k \in \hat{b}'} m^c(b_k) = \sum_{b_k \in \hat{b}'} (m^{c'}(b_k) - m^c(b_k)) = \sum \delta \qquad \text{Eq. (26)}$$

$$PM^B(\hat{b}) - PM^A(\hat{b}) = \sum_{b_k \in \hat{b}} m^{c'}(b_k) - \sum_{b_k \in \hat{b}} m^c(b_k) = \sum_{b_k \in \hat{b}} (m^{c'}(b_k) - m^c(b_k)) = \sum \delta \qquad \text{Eq. (27)}$$

where, c=0, 1. From Eq. (26) and Eq. (27), we derive, $$PM^B(\hat{b}')-PM^A(\hat{b}')=PM^B(\hat{b})-PM^A(\hat{b}) \qquad \text{Eq. (28)}$$

Eq. (28) may be re-written as, $$PM^A(\hat{b}')-PM^A(\hat{b})=PM^B(\hat{b}')-PM^B(\hat{b}) \qquad \text{Eq. (29)}$$

From Eq. 29 and Eq. 25, we have $PM^A(\hat{b}') \leq PM^A(\hat{b})$.

Since $PM^A(\hat{b})$ is already the minimum path distance, $PM^A(\hat{b}')$ must also equal to the minimum path distance rendering $\hat{b}'$ the decoded sequence for method A. There is only one survivor path in Viterbi algorithm (VA) decoding implying there can only be one decoded bit sequence, therefore $\hat{b}'=\hat{b}$ and the assertion is proved.

In an alternative embodiment of the present invention, the soft demapping rules in Eqs. (11) and (12), determination of the path metrics, and decoding of the received signal are performed using hardware.

The receiver system (shown in FIG. 1) includes a processor (not shown), or computer medium, some type of storage area and a computer readable medium, for storing the software/firmware described in FIG. 1. The processor executes codes from the computer readable medium for effectuating the functions outlined in FIG. 1.

Although the present invention has been described in terms of specific embodiment, it is anticipated that alterations and modifications thereof will no doubt become apparent to those more skilled in the art. It is therefore intended that the following claims be interpreted as covering all such alterations and modification as fall with in the true spirit and scope of the invention.

What is claimed is:

1. A receiver system for receiving signals comprising:
a demapper device being responsive to an equalizer output for processing the equalizer output to generate a demapper output, said demapper output for including one or more bit metrics, said receiver system being responsive to a received signal for processing the received signal to generate said equalizer output, said demapper device for using a distance measure to calculate said bit metrics, said receiver system for using said demapper output to generate a processed output; and
a convolutional decoder being responsive to said processed output for processing the processed output to generate a decoded bit sequence, said convolutional decoder for using said processed output to generate one or more path metrics, said convolutional decoder for using said bit metrics and said path metrics to generate said decoded bit sequence, said receiver system for using said distance measure to reduce the size of said bit metrics and the size of said path metrics to improve the performance of said convolutional decoder;
wherein said received signal being modulated using a modulation scheme, said received signal for including a bit sequence comprising an in-phase bit $b_{I,k}$ and a quadrature bit $b_{Q,k}$, said modulation scheme for including a constellation for being partitioned into two sets of in-phase symbols $S_{I,k}^{(0)}$ and $S_{I,k}^{(1)}$, said constellation for being partitioned into two sets of quadrature symbols $S_{Q,k}^{(0)}$ and $S_{Q,k}^{(1)}$; and
wherein said distance measure is a simplified Manhattan distance having an in-phase part $d_{I,k}^c$ and a quadrature part $d_{Q,k}^c$, said equalizer output for including an $i^{th}$ subcarrier, each of said bit metrics for including an in-phase bit metric $m(b_{I,k})^c$ and a quadrature bit metric $m(b_{Q,k})^c$, said demapper device for using a channel frequency response $H(i)$ for said $i^{th}$ subcarrier and a minimum function (min) to calculate said in-phase bit metric according to $$m(b_{I,k})^c = |H(i)|^2 \cdot \min_{\alpha \in S_{I,k}^{(c)}} |y_I[i] - \alpha_I| = |H(i)|^2 \cdot d_{I,k}^c, c = 0, 1.$$

2. A receiver system as recited in claim 1 being an orthogonal frequency division multiplexing (OFDM) baseband receiver, said convolutional decoder being a Viterbi decoder, said received signal for including bit interleaved coded modulation (BICM) orthogonal frequency division multiplexing (OFDM)-modulated packets.

3. A receiver system as recited in claim 1 wherein said demapper device for calculating said quadrature bit metric according to $$m(b_{Q,k})^c = |H(i)|^2 \cdot \min_{\alpha \in S_{Q,k}^{(c)}} |y_Q[i] - \alpha_Q| = |H(i)|^2 d_{Q,k}^c, c = 0, 1.$$

4. A receiver system as recited in claim 1 wherein said convolutional decoder for using two pairs of said bit metrics $m0^c$ and $m1^c$, c=0,1, to calculate four branch metrics according to $$BM[0]=m0^0+m1^0$$

$$BM[1]=m0^0+m1^1$$

$BM[2]=m0^1+m1^0$ $BM[3]=m0^1+m1^1$.

5. A receiver system as recited in claim 4 wherein said branch metrics being assigned to four nodes at the initial time step of a trellis, each said node of said trellis for having associated therewith two paths for leading to two said nodes of said trellis, said convolutional decoder for including a branch metric unit for determining a branch metric associated with each of said paths.

6. A receiver system as recited in claim 5 wherein each said node of said trellis having associated therewith a path metric, said path metric being updated by adding said branch metric of said path to said path metric of said node to generate one or more updated path metrics, said convolutional decoder for including an add/compare/select (ACS) unit for storing said updated path metrics.

7. A receiver system as recited in claim 6 wherein said add/compare/select (ACS) unit for comparing said updated path metrics to determine a minimum path metric for each of said nodes, said minimum path metric having a minimum path associated therewith, said convolutional decoder further including a trace back unit for tracing back said minimum path to determine said decoded bit sequence.

8. A receiver system as recited in claim 1 for using saturation limits for said in-phase part $d_{I,k}{}^c$ and said quadrature part $d_{Q,k}{}^c$ of said simplified Manhattan distance to reduce the size of said bit metrics substantially.

9. A receiver system as recited in claim 1 wherein said modulation scheme being a 16 quadrature amplitude modulation (QAM) scheme, said in-phase part and said quadrature part of said simplified Manhattan distance being calculated for said 16 quadrature amplitude modulation (QAM) scheme using an in-phase component of an equalizer output $y_I[i]$ according to $$d_{I,0}^0 = \begin{cases} |y_I[i]+3|, & -4 < y_I[i] < -2 \\ |y_I[i]+1|, & -2 \le y_I[i] < 4 \end{cases}$$

$$d_{I,0}^1 = \begin{cases} |y_I[i]-1|, & -4 < y_I[i] < 2 \\ |y_I[i]-3|, & 2 \le y_I[i] < 4 \end{cases}$$

$$d_{I,1}^0 = |3-|y_I[i]||, \quad -4 < y_I[i] < 4$$

$$d_{I,1}^1 = |1-|y_I[i]||, \quad -4 < y_I[i] < 4.$$

10. A receiver system as recited in claim 1 wherein said modulation scheme being a 64 quadrature amplitude modulation (QAM) scheme, said in-phase part and said quadrature part of said simplified Manhattan distance being calculated for said 64 quadrature amplitude modulation (QAM) scheme using said in-phase component of said equalizer output according to $$d_{I,0}^0 = \begin{cases} |y_I[i]+7|, & -8 < y_I[i] < -6 \\ |y_I[i]+5|, & -6 \le y_I[i] < -4 \\ |y_I[i]+3|, & -4 \le y_I[i] < -2 \\ |y_I[i]+1|, & -2 \le y_I[i] < 8 \end{cases}$$

$$d_{I,0}^1 = \begin{cases} |y_I[i]-1|, & -8 < y_I[i] < 2 \\ |y_I[i]+5|, & -6 \le y_I[i] < -4 \\ |y_I[i]+3|, & -4 \le y_I[i] < -2 \\ |y_I[i]+1|, & -2 \le y_I[i] < 8 \end{cases}$$

-continued $$d_{I,1}^0 = \begin{cases} |7-|y_I[i]||, & 6 \le y_I[i] < 8 \\ |5-|y_I[i]||, & |y_I[i]| < 6 \end{cases}$$

$$d_{I,1}^1 = \begin{cases} |3-|y_I[i]||, & 2 \le y_I[i] < 8 \\ |1-|y_I[i]||, & |y_I[i]| < 2 \end{cases}$$

$$d_{I,2}^0 = \begin{cases} |7-|y_I[i]||, & 4 \le y_I[i] < 8 \\ |1-|y_I[i]||, & |y_I[i]| < 4 \end{cases}$$

$$d_{I,2}^1 = \begin{cases} |5-|y_I[i]||, & 4 \le y_I[i] < 8 \\ |3-|y_I[i]||, & |y_I[i]| < 4. \end{cases}$$

11. A receiver system as recited in claim 1 further including a de-interleaver device being responsive to said demapper output for processing the same to generate a de-interleaved output, said de-interleaving device for reordering the randomized bit sequences of said demapper output to generate said de-interleaved output.

12. A receiver system as recited in claim 11 further including a de-puncturer device being responsive to said de-interleaved output for processing the same to generate said processed output, said de-puncturer device for re-inserting the removed bits back in the middle position of said processed output.

13. A receiver system as recited in claim 1 wherein said distance measure is a simplified Euclidean distance having an in-phase part $(d_{I,k}{}^c)^2$ and a quadrature part $(d_{Q,k}{}^c)^2$, said demapper device for calculating said in-phase bit metric according to $$m(b_{I,k})^c = |H(i)|^2 \cdot \min_{\alpha \in S_{I,k}^{(c)}} |y_I[i] - \alpha_I|^2 = |H(i)|^2 \cdot (d_{I,k}^c)^2, \quad c = 0, 1.$$

14. A receiver system as recited in claim 13 wherein said demapper device for calculating said quadrature bit metric according to $$m(b_{Q,k})^c = |H(i)|^2 \cdot \min_{\alpha \in S_{Q,k}^{(c)}} |y_Q[i] - \alpha_Q|^2 = |H(i)|^2 \cdot (d_{Q,k}^c)^2, \quad c = 0, 1.$$

15. A method for receiving signals comprising:
receiving an equalizer output with an $i^{th}$ subcarrier and processing the equalizer output to generate a demapper output;
processing a received signal to generate the equalizer output;
calculating an in-phase bit metric using a channel frequency response H(i) for said $i^{th}$ subcarrier and a minimum function (min) according to $$m(b_{I,k})^c = |H(i)|^2 \cdot \min_{\alpha \in S_{I,k}^{(c)}} |y_I[i] - \alpha_I|^2 = |H(i)|^2 \cdot d_{I,k}^c, \quad c = 0, 1;$$

calculating one or more bit metrics, including an in-phase bit metric $m(b_{I,k})^c$ and a quadrature bit metric $m(b_{Q,k})^c$, using a simplified Manhattan distance measure having an in-phase part $d_{I,k}{}^c$ and a quadrature part $d_{Q,k}{}^c$;
generating a processed output;
generating one or more path metrics;

generating a decoded bit sequence; reducing the size of the bit metrics and the size of the path metrics to generate the decoded bit sequence; and modulating said received signal into an in-phase bit $b_{I,k}$ and a quadrature bit $b_{Q,k}$ partitioning a constellation into two sets of in-phase symbols $S_{I,k}^{(0)}$ and $S_{I,k}^{(1)}$, and partitioning a constellation into two sets of quadrature symbols $S_{Q,k}^{(0)}$ and $S_{Q,k}^{(1)}$.

16. A receiver system for receiving signals comprising:

a demapper device being responsive to an equalizer output for processing the equalizer output to generate a demapper output, said demapper output for including one or more bit metrics, said receiver system being responsive to a received signal for processing the received signal to generate said equalizer output, said demapper device for using a distance measure to calculate said bit metrics, said receiver system for using said demapper output to generate a processed output; and a convolutional decoder being responsive to said processed output for processing the processed output to generate a decoded bit sequence, said convolutional decoder for using said bit metrics to generate said decoded bit sequence, said receiver system for using said distance measure to reduce the size of said bit metrics to improve the performance of said convolutional decoder;

wherein said received signal being modulated using a modulation scheme, said received signal for including a bit sequence comprising an in-phase bit $b_{I,k}$ and a quadrature bit $b_{Q,k}$, said modulation scheme for including a constellation for being partitioned into two sets of in-phase symbols $S_{I,k}^{(0)}$ and $S_{I,k}^{(1)}$, said constellation for being partitioned into two sets of quadrature symbols $S_{Q,k}^{(0)}$ and $S_{Q,k}^{(1)}$; and wherein said distance measure is a simplified Manhattan distance having an in-phase part $d_{I,k}^c$ and a quadrature part $d_{Q,k}^c$, said equalizer output for including an $i^{th}$ subcarrier, each of said bit metrics for including an in-phase bit metric $m(b_{I,k})^c$ and a quadrature bit metric $m(b_{Q,k})^c$, said demapper device for using a channel frequency response H(i) for said $i^{th}$ subcarrier and a minimum function (min) to calculate said in-phase bit metric according to $$m(b_{I,k})^c = |H(i)|^2 \cdot \min_{\alpha \in S_{I,k}^{(c)}} |y_I[i] - \alpha_I|^2 = |H(i)|^2 \cdot d_{I,k}^c, c = 0, 1.$$

17. A receiver system for receiving signals comprising:

means for receiving an equalizer output with an $i^{th}$ subcarrier and for processing the equalizer output to generate a demapper output;

means for processing a received signal to generate the equalizer output;

means for using a channel frequency response H(i) for said $i^{th}$ subcarrier and a minimum function (min) to calculate said in-phase bit metric according to $$m(b_{I,k})^c = |H(i)|^2 \cdot \min_{\alpha \in S_{I,k}^{(c)}} |y_I[i] - \alpha_I|^2 = |H(i)|^2 \cdot d_{I,k}^c,$$

c=0,1, or for using a simplified Manhattan distance measure, having an in-phase part $d_{I,k}^c$ and a quadrature part $d_{Q,k}^c$, to calculate one or more bit metrics, including an in-phase bit metric $m(b_{I,k})^c$ and a quadrature bit metric $m(b_{Q,k})^c$;

means for generating a processed output;

means for generating one or more path metrics;

means for generating a decoded bit sequence;

means for reducing the size of the bit metrics and the size of the path metrics to generate the decoded bit sequence; and means for modulating said received signal into an in-phase bit $b_{I,k}$ and a quadrature bit $b_{Q,k}$, said modulation means including a means of partitioning a constellation into two sets of in-phase symbols $S_{I,k}^{(0)}$ and $S_{I,k}^{(1)}$, and said modulation means further including a means of partitioning a constellation into two sets of quadrature symbols $S_{Q,k}^{(0)}$ and $S_{Q,k}^{(1)}$.

18. A computer readable medium having stored therein computer readable program code comprising:

receiving an equalizer output with an $i^{th}$ subcarrier for processing the equalizer output to generate a demapper output;

processing a received signal to generate the equalizer output;

calculating an in-phase bit metric using a channel frequency response H(i) for said $i^{th}$ subcarrier and a minimum function (min) according to $$m(b_{I,k})^c = |H(i)|^2 \cdot \min_{\alpha \in S_{I,k}^{(c)}} |y_I[i] - \alpha_I|^2 = |H(i)|^2 \cdot d_{I,k}^c, c = 0, 1;$$

calculating one or more bit metrics including an in-phase bit metric $m(b_{I,k})^c$ and a quadrature bit metric $m(b_{Q,k})^c$, using a simplified Manhattan distance measure having an in-phase part $d_{I,k}^c$ and a quadrature part $d_{Q,k}^c$;

generating a processed output;

generating one or more path metrics;

generating a decoded bit sequence;

reducing the size of the bit metrics and the size of the path metrics to generate the decoded bit sequence; and modulating said received signal into an in-phase bit $b_{I,k}$ and a quadrature bit $b_{Q,k}$, partitioning a constellation into two sets of in-phase symbols $S_{I,k}^{(0)}$ and $S_{I,k}^{(1)}$, and partitioning a constellation into two sets of quadrature symbols $S_{Q,k}^{(0)}$ and $S_{Q,k}^{(1)}$.

* * * * *